(12) United States Patent
Horino

(10) Patent No.: US 7,488,964 B2
(45) Date of Patent: Feb. 10, 2009

(54) PHOTO COUPLER AND METHOD FOR PRODUCING THE SAME

(75) Inventor: Kanako Horino, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/047,758

(22) Filed: Mar. 13, 2008

(65) Prior Publication Data

US 2008/0230727 A1 Sep. 25, 2008

(30) Foreign Application Priority Data

Mar. 23, 2007 (JP) ............................. 2007-077441

(51) Int. Cl.
*H01L 31/12* (2006.01)
(52) U.S. Cl. ............................. 250/551; 257/81; 428/25
(58) Field of Classification Search ................. 250/551, 250/239; 257/80–82, 666, 676; 438/24–26, 438/107, 111, 112
See application file for complete search history.

(56) References Cited

U.S. PATENT DOCUMENTS

| | | | |
|---|---|---|---|
| 4,160,308 A * | 7/1979 | Courtney et al. ............... | 438/25 |
| 4,446,375 A | 5/1984 | Aird | |
| 4,694,183 A * | 9/1987 | Merrick et al. ............... | 250/551 |
| 4,745,294 A * | 5/1988 | Kohashi et al. ............. | 250/551 |
| 4,863,806 A * | 9/1989 | Merrick et al. ............... | 428/571 |
| 4,980,568 A * | 12/1990 | Merrick et al. ............... | 250/551 |
| 5,148,243 A * | 9/1992 | Merrick et al. ................ | 257/81 |
| 5,389,578 A * | 2/1995 | Hodson et al. ................ | 438/25 |
| 5,665,983 A * | 9/1997 | Nagano ........................ | 257/81 |
| 7,176,473 B2 * | 2/2007 | Aki et al. ..................... | 250/551 |
| 2005/0116145 A1 * | 6/2005 | Aki et al. .................. | 250/214.1 |

* cited by examiner

*Primary Examiner*—John R Lee
(74) *Attorney, Agent, or Firm*—Sughrue Mion, PLLC

(57) ABSTRACT

In structures of the typical conventional photo couplers, an unwanted rotation or a dislocation during the manufacturing thereof is occurred during the manufacture of the couplers. The photo coupler according to the embodiment includes a lead frame (first lead frame), a lead frame (second lead frame) having an end section bent toward the lead frame, a light emitting element (first optical device) fixed to the lead frame, a light receiving element (second optical device) fixed to the lead frame so as to face the light emitting element, and an electrically insulating film, provided between the light emitting element and the light receiving element, and including an end section having protruding and contracting sections in plan view. An end section of the lead frame has protruding and contracting sections in plan view. Further, the end section of the electrically insulating film fits in the end section of the lead frame.

7 Claims, 16 Drawing Sheets

PHOTO COUPLER AND METHOD FOR PRODUCING THE SAME

This application is based on Japanese patent application No. 2007-77,441, the content of which is incorporated hereinto by reference.

BACKGROUND

1. Technical Field

The present invention relates to a photo coupler and a method for producing thereof.

2. Related Art

Photo couplers are devices that exchange signals by optics, in which an input side (emitting-side) is electrically insulated from an output side (receiving-side). Various technologies are proposed for providing an increased isolation voltage between the input side and the output side, and among these, a structure, which includes light emitting elements and light receiving elements that are disposed to be opposed to the light emitting elements and also includes an electrically insulating film disposed therebetween, are broadly adopted, since such structure provides an increased internal creeping distance between the light receiving element and the light emitting element to achieve an improved isolation voltage.

Japanese Patent Laid-Open No. S58-95,879 (1983) describes a method for producing photo couplers having a structure that includes an electrically insulating film disposed between the light receiving element and the light emitting element. The method for producing the photo couplers disclosed in Japanese Patent Laid-Open No. S58-95,879 is described in reference to FIG. 8 to FIG. 13. The FIG. 13 inclusively shows processes shown in FIG. 8 to FIG. 12.

First of all, one piece of a lead frame 130 is prepared for installing both of the light emitting element 101 and the light receiving element 102 (FIG. 8). The lead frame 130 is composed of a lead frame 106 for the light emitting element 101 and a lead frame 103 for the light receiving element 102. Then, the light emitting element 101 and the light receiving element 102 are installed on an upper principal surface of the lead frame 130, and then are wired to respective lead terminals by a wire bonding process (FIG. 9).

Next, a smaller amount of transparent silicone resin 104 is applied over an upper surface of the light receiving element 102, and an electrically insulating film 105 is installed thereon, and then the silicone resin 104 is cured. Subsequently, a transparent silicone resin 107 is applied over the light emitting element 101. Thereafter, the lead frame 130 is bent at a certain location so that the light emitting element 101 and the light receiving element 102 are mutually opposed with the electrically insulating film 105 disposed therebetween (see FIG. 10 and FIG. 11). This achieves an optical coupling between the light receiving element 102 and the light emitting element 101.

Next, the silicone resins 104 and 107 are completely cured to obtain a hardened structure, thereby forming an encapsulating material 108. Then, unwanted sections in the lead frame 130 are removed to form geometry as shown in FIG. 12.

A process for installing an electrically insulating film on a lead frame in the side of a photo acceptor in the current manufacturing process for general opposed couplers will be described below. First of all, as shown in FIG. 14A, a soft transparent silicone resin 104 is applied over the lead frame 103 in the side of a photo acceptor, and then the electrically insulating film 105 is installed thereon. Then, as shown in FIG. 14B, the electrically insulating film 105 is depressed by its self-weight, and is inclined toward various directions. Therefore, as shown in FIG. 14C, the electrically insulating film 105 may rotate along "A" direction, or may dislocate along "B" or "C" direction.

Then, distances D and E between the end sections of the encapsulating material 108 and the electrically insulating film 105, respectively may be extremely decreased as shown in FIGS. 15A and 15B, depending upon the level of unwanted rotation or dislocation of the electrically insulating film 105. This triggers a failure in the production of the photo coupler. For example, the electrically insulating film 105 may partially protrude beyond the encapsulating material 108, or a package-crack may be generated on thinned sections of the encapsulating material 108 (sections indicated by "distance D and E") due to a stress concentrating during the production.

SUMMARY

According to one aspect of the present invention, there is provided a photo coupler, comprising: a first lead frame; a second lead frame having an end section bent toward the first lead frame; a first optical device, which is one of a light emitting element and a light receiving element, and is fixed to the first lead frame; a second optical device, which is the other of the light emitting element and the light receiving element and is fixed to the second lead frame so as to be opposed to the first optical device; and an electrically insulating film, provided between the first optical device and the second optical device, and including an end section having protruding and contracting sections in plan view, wherein the end section of the second lead frame has protruding and contracting sections in plan view, and wherein the end section of the electrically insulating film is fitted in the end section of the second lead frame.

In this photo coupler, protruding and contracting sections are provided in both end sections of the electrically insulating film and the second lead frame. Further, one of the end sections fits in the other of the end sections. This allows preventing the electrically insulating film from causing an unwanted rotation or a dislocation during the manufacturing thereof.

According to another aspect of the present invention, there is provided a method for manufacturing the photo coupler as described above, comprising: fixing the first optical device and the second optical device to the first lead frame and the second lead frame, respectively; disposing the electrically insulating film on the second optical device fixed to the second lead frame, so that the end section of the electrically insulating film is fitted in the end section of the second lead frame; and fixing the first lead frame to the electrically insulating film, so that the first optical device faces the second optical device across the electrically insulating film.

In such manufacturing method, the electrically insulating film is disposed, so that the end section of the electrically insulating film is fitted in the end section of the second lead frame. This allows preventing the electrically insulating film from causing an unwanted rotation or a dislocation.

According to the present invention, a photo coupler, which is capable of preventing the electrically insulating film from causing an unwanted rotation or a dislocation during the manufacturing thereof, and a method for manufacturing thereof, are achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations according to the present invention will be described in reference to the annexed figures. In all figures, an identical numeral is assigned to an element commonly appeared in the figures, and the detailed description thereof will not be repeated.

Figure 1A:
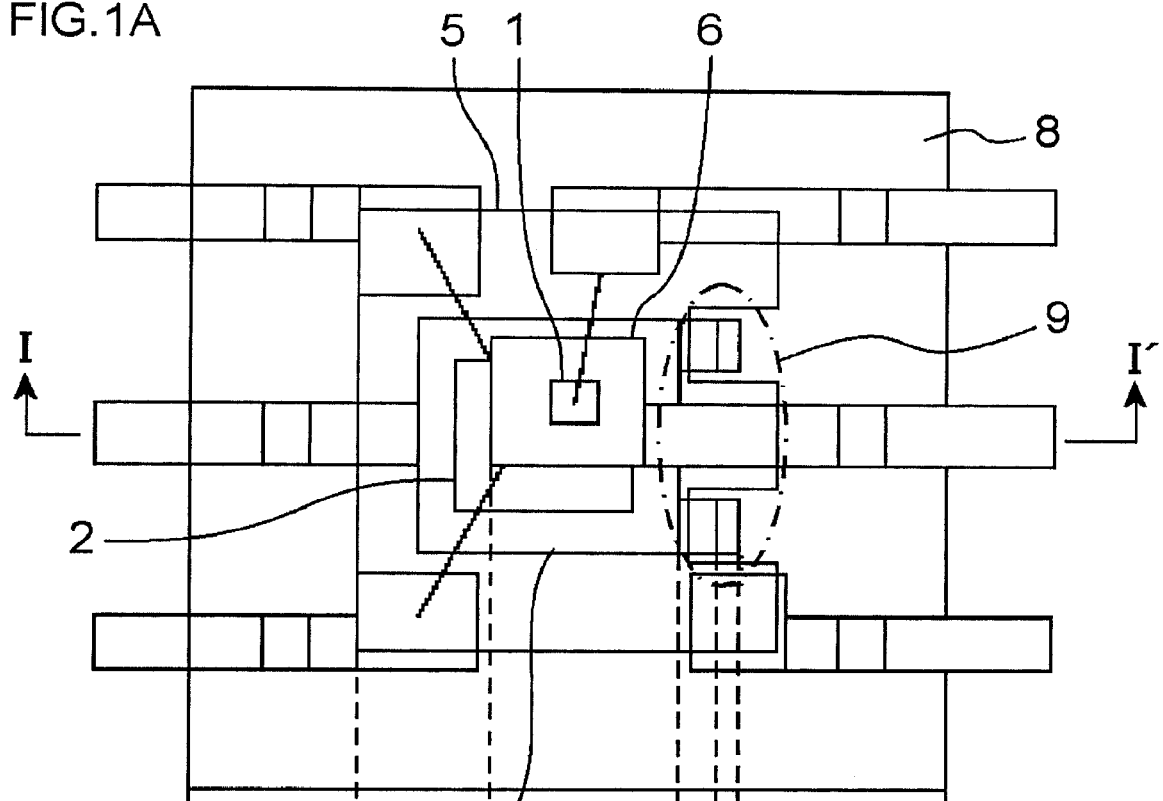
FIG. 1A is a schematic plan view, illustrating an embodiment of a photo coupler according to the present invention.
Figure 1B:
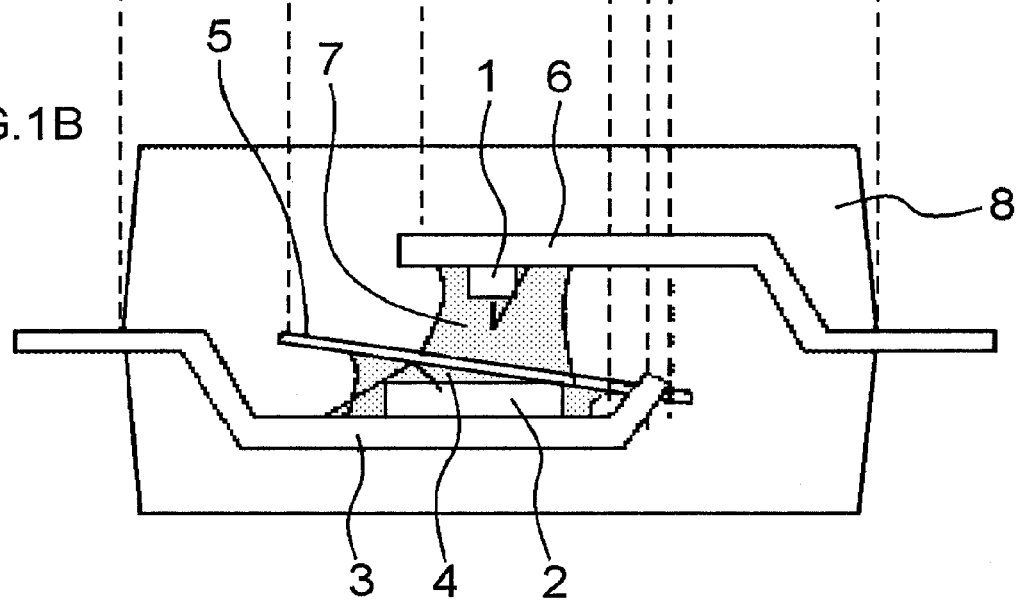
FIG. 1B is a cross-sectional view, illustrating an embodiment of a photo coupler according to the present invention.
Figure 2A:
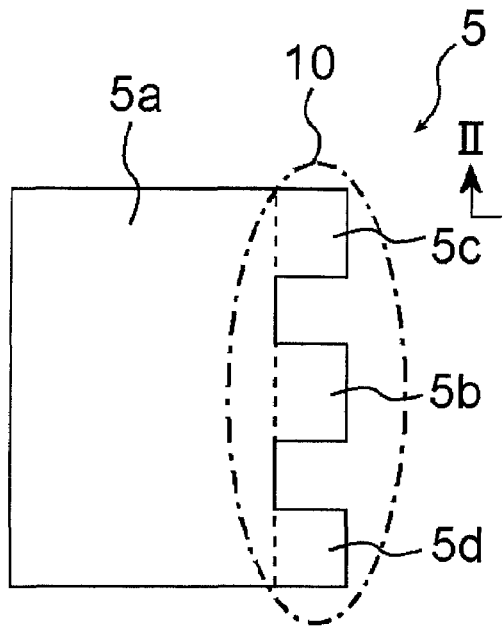
FIG. 2A is a diagram, illustrating an electrically insulating film provided in a photo coupler of FIG. 1.
Figure 2B:
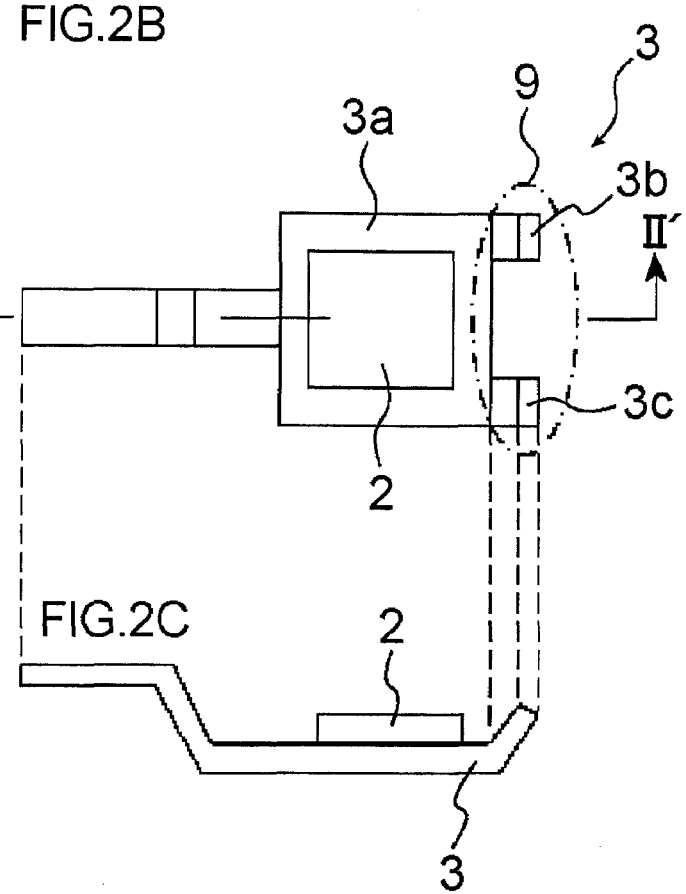
FIG. 2B is a schematic plan view, illustrating a second lead frame.

FIG. 1 illustrates an embodiment of a photo coupler according to the present invention. FIG. 2A and FIG. 2B illustrate an electrically insulating film 5 and a lead frame 3, which are provided to the photo coupler, respectively. The lead frame 3 in a status of having a light receiving element 2 installed thereto is shown in FIGS. 2B and 2C.

The photo coupler includes a lead frame 6 (first lead frame), a lead frame 3 (second lead frame) having an end section 9 bent toward the lead frame 6, a light emitting element 1 (first optical device) fixed to the lead frame 6, a light receiving element 2 (second optical device) fixed to the lead frame 3 so as to face the light emitting element 1, and an electrically insulating film 5, provided between the light emitting element 1 and the light receiving element 2, and including an end section 10 having protruding and contracting sections in plan view. An end section 9 of the lead frame 3 has protruding and contracting sections in plan view. Further, the end section 10 of the electrically insulating film 5 fits in the end section 9 of the lead frame 3. The light emitting element 1 and the light receiving element 2 are, for example, a light emitting diode and a photodiode, respectively. An electrically insulating film 5 is fixed the light receiving element 2 and the lead frame 3 by a transparent resin 4. Further, the light emitting element 1 and the lead frame 6 are fixed to the electrically insulating film 5 by a transparent resin 7. The resins 4 and 7 are, for example, silicone resins. Further, an encapsulating material 8 is formed so as to cover the light emitting element 1, the light receiving element 2, the lead frame 3, the electrically insulating film 5 and the lead frame 6.

As shown in FIG. 2A, the electrically insulating film 5 includes a base 5a (first base) and a protruding portion 5b protruding from the base 5a (first protruding portion) The electrically insulating film 5 further includes a protruding portion 5c (fourth protruding portion) and a protruding portion 5d (fifth protruding portion), both of which also protrude from the base 5a. The electrically insulating film 5 having such geometry may be obtained by a punching process with, for example, a metal mold. Therefore, a material of electrically insulating film 5 is preferably composed of a suitable material having a suitable thickness, which is transparent and is capable of being easily cut with a metal mold. Typical example of such material may be, for example, polyimide resins.

Figure 2C:
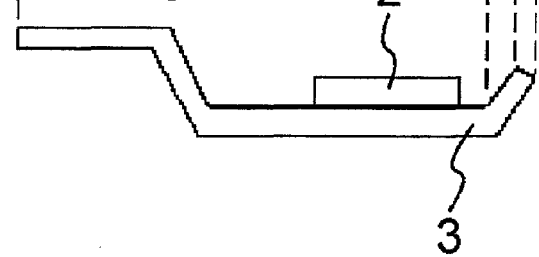
FIG. 2C is a cross-sectional view, illustrating a second lead frame.

On the other hand, as shown in FIGS. 2B and 2C, the lead frame 3 includes a base 3a (the second base), and a protruding portion 3b (second protruding portion) and a protruding portion 3c (the third protruding portion), both of which protrude from the base 3a. The lead frame 3 having such geometry may be obtained by an etching process or a pressing process. Typical materials for the lead frame 3 may include copper, iron and the like.

Figure 3A:
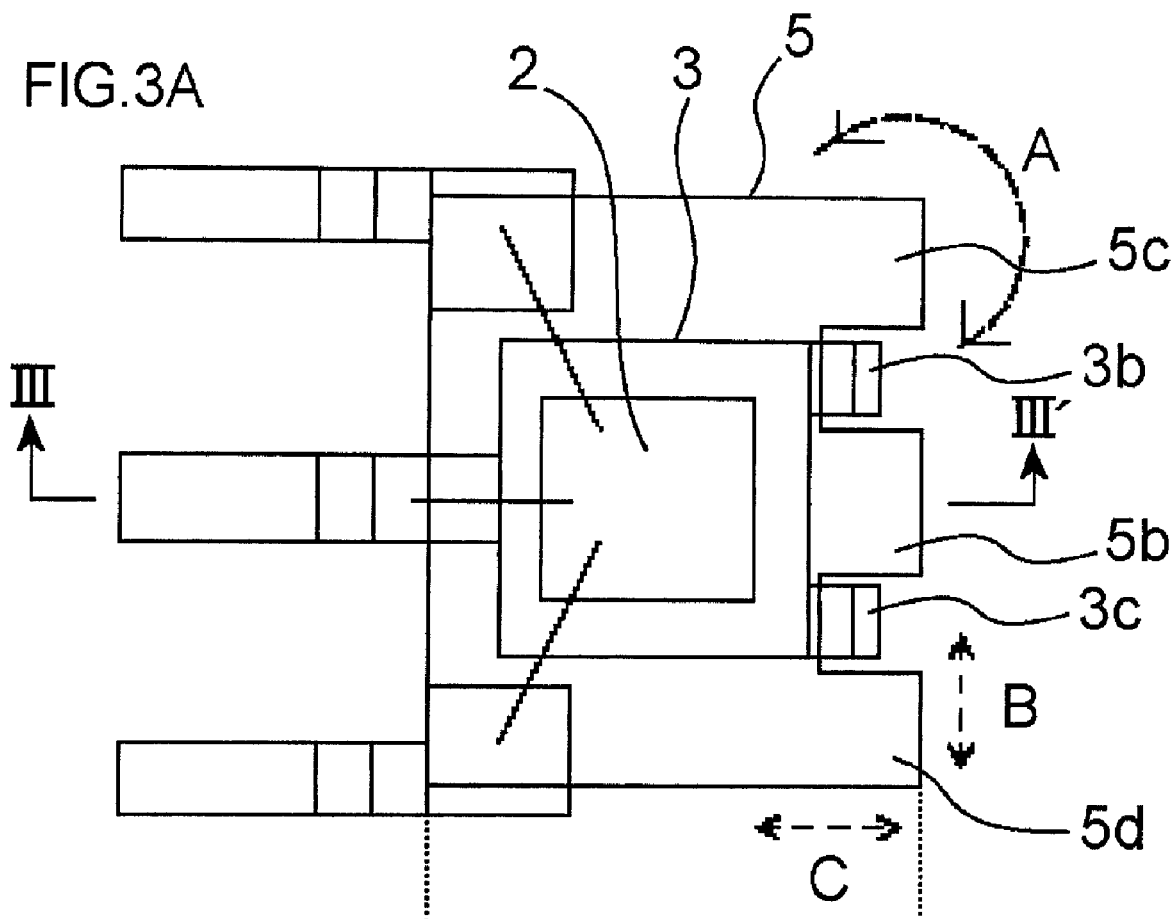
FIG. 3A is a schematic plan view, illustrating a structure after disposing an electrically insulating film.
Figure 3B:
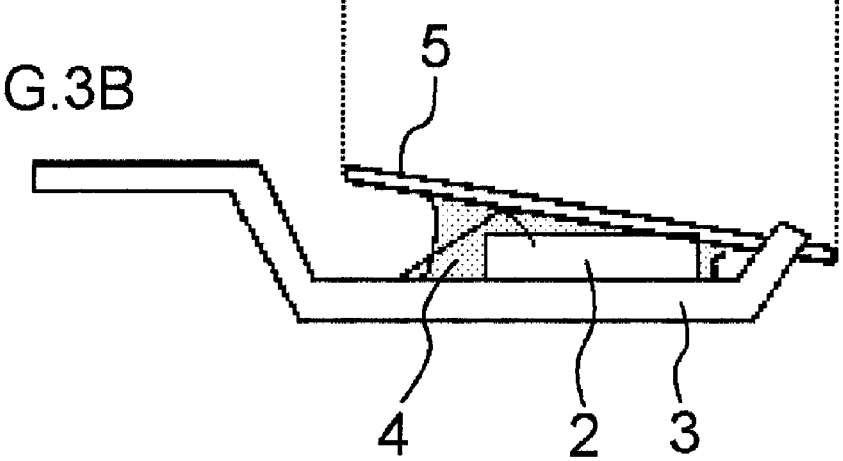
FIG. 3B is a cross-sectional view, illustrating a structure after disposing an electrically insulating film.

As shown in FIGS. 3A and 3B, the electrically insulating film 5 is disposed on the light receiving element 2, and then, the protruding portion 5b of the electrically insulating film 5 interposes between the protruding portions 3b and 3c of lead frame 3. The protruding portion 3b of the lead frame 3 also interposes between the protruding portions 5b and 5c of the electrically insulating film 5. Similarly, the protruding portion 3c of the lead frame 3 is disposed between the protruding portions 5b and 5d of the electrically insulating film 5.

Figure 4:
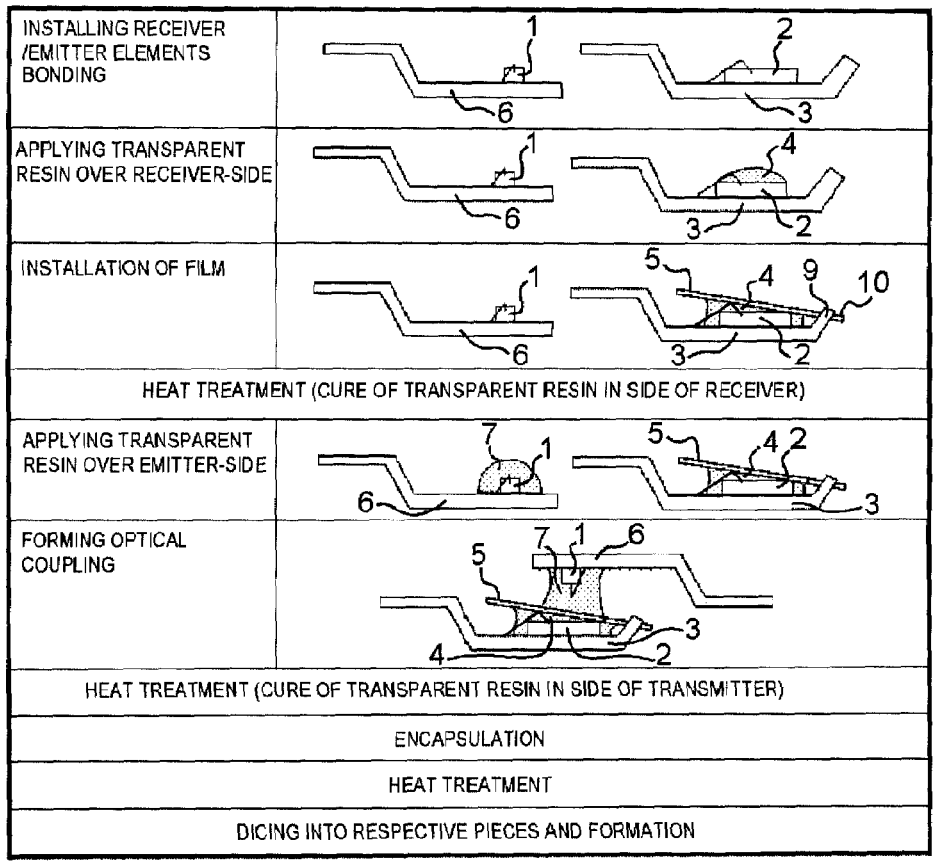
FIG. 4 is a diagram, useful in describing an embodiment of the process for manufacturing the photo coupler according to the present invention.

In reference to FIG. 4, an exemplary implementation of a process for manufacturing a photo coupler shown in FIGS. 1A and 1B will be described as an embodiment of a process for manufacturing a photo coupler according to the present invention. First of all, the light emitting element 1 and the light receiving element 2 are fixed to the lead frame 6 and the lead frame 3, respectively. Subsequently, the resin 4 is applied over the light receiving element 2, and then the electrically insulating film 5 is provided on the light receiving element 2 fixed to the lead frame 3, so that the end section 10 of the electrically insulating film 5 fits in the end section 9 of the lead frame 3. Thereafter, the resin 4 is cured.

Next, the resin 7 is applied over the light emitting element 1, and then the lead frame 6 is fixed to the electrically insulating film 5, so that the light emitting element 1 faces the light receiving element 2 across the electrically insulating film 5. This allows forming an optical coupling of the light emitting element 1 with the light receiving element 2. Subsequently, the resins 4 and 7 are completely cured to obtain a hardened structure, thereby forming the encapsulating material 8. The photo coupler of FIGS. 1A and 1B is here obtained, according to the above-described process.

Advantageous effects of the present embodiment will be described. In the present embodiment, the protruding and the contracting sections are provided in the end section 10 of the electrically insulating film 5 and the end section 9 of the lead frame 3. The end section 10 fits in the end section 9. This allows preventing the electrically insulating film 5 from causing an unwanted rotation or a dislocation during the manufacture thereof. More specifically, this allows preventing the electrically insulating film 5 from rotating along "A" direction, or from dislocating along "B" or "C" direction, as shown in FIG. 3A.

Figure 10:
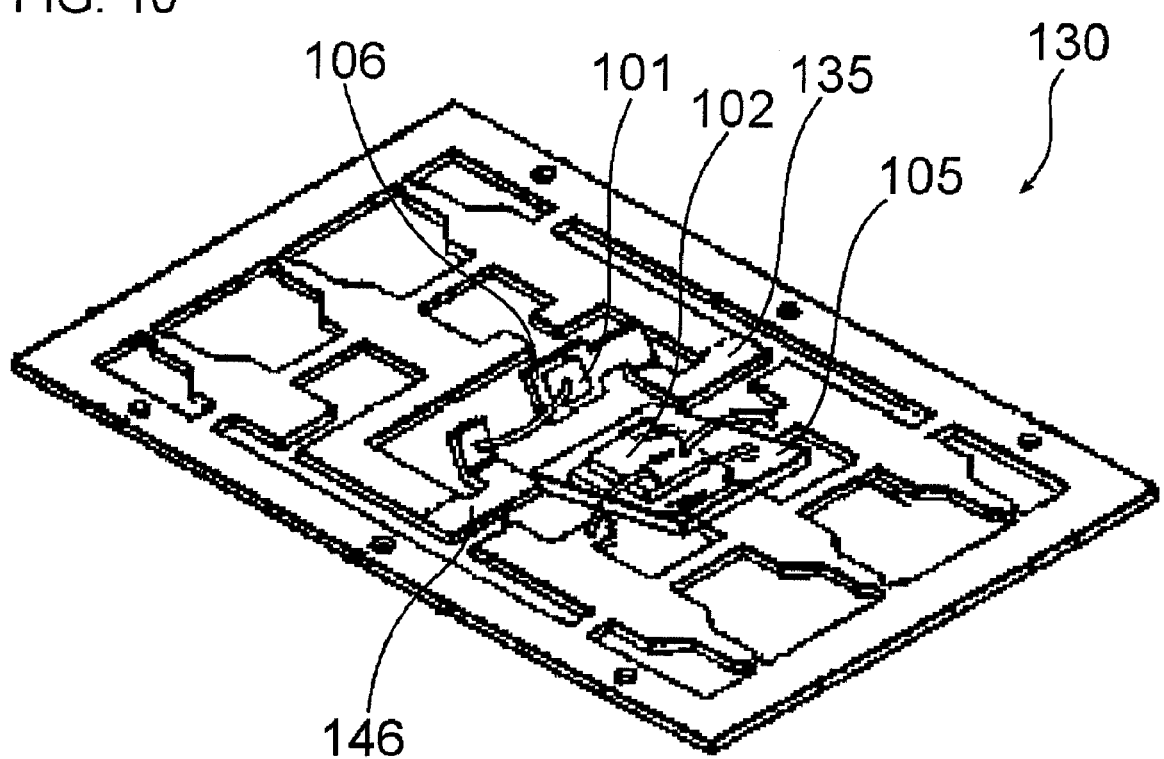
FIG. 10 is a diagram, useful in describing an embodiment of the process for manufacturing the photo coupler according to the conventional photo coupler.

Meanwhile, in the case of the process for manufacturing the photo coupler described in Japanese Patent Laid-Open No. S58-95,879, an electrically insulating film 105 is supported by end sections 135 and 146 in the emitter-side lead frame as shown in FIG. 10, and thus it might be considered that this configuration provides an inhibition for the rotation. However, the rotation of the electrically insulating film 105 is mainly caused during the sinking of the electrically insulating film 105 in a silicone resin 104 by its self weight. Therefore, when the level of the bending of the emission side lead frame 106 is smaller and the end sections 135 and 146 are located below a stabilized position of the electrically insulating film 105, a dislocation or a rotation may be generated.

Needless to add, a rotation of the electrically insulating film 105 can be prevented by providing the emitter-side lead frame 103 having larger level of bending to form a structure, in which the end sections 135 and 146 are located above the stabile position of the electrically insulating film 105. However, in such case, the following problem may be caused.

The end sections 135 and 146, which function as weights for pushing the electrically insulating film 105 is a portion of the lead frame 106, which is in the side opposite to the side having the electrically insulating film 105 thereon. Therefore, the photo coupler described in Japanese Patent Laid-Open No. S58-95,879 has the structure, in which the electrically insulating film 105 is inevitably in contact with both of the upper and lower lead frames 103 and 106 (see FIG. 12). If both of the lead frames 103 and 106 are brought into contact with the electrically insulating film 105, an internal creeping distance thereof is decreased, causing a problem of deterioration in the isolation voltage. Thus, it is not preferable to have a structure, in which the electrically insulating film 105 is supported by the lead frame 106 that is in the side opposite to the side having the electrically insulating film 105 thereon. Further, if the emitter-side lead frame 106 is bent, an additional space as indicated by "F" in FIG. 11 may be created, and thus this causes a difficulty in the downsizing of the device.

Figure 11:
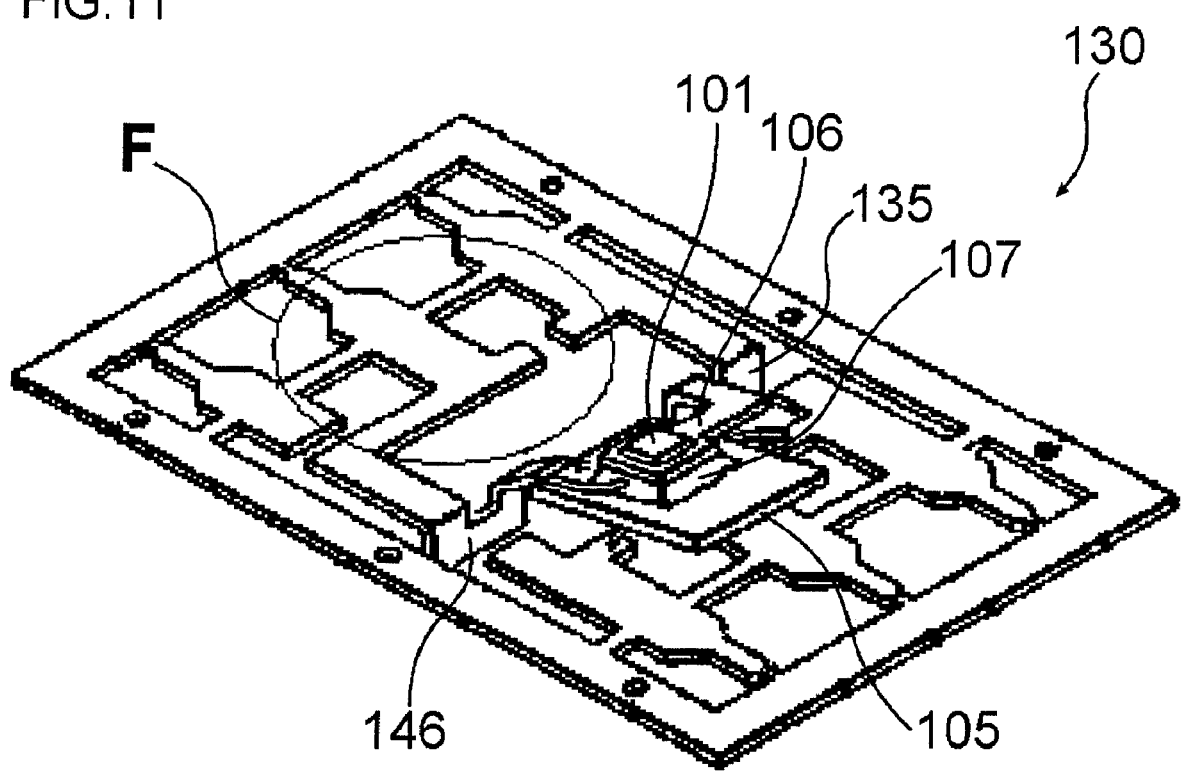
FIG. 11 is a diagram, useful in describing an embodiment of the process for manufacturing the photo coupler according to the conventional photo coupler.
Figure 12:
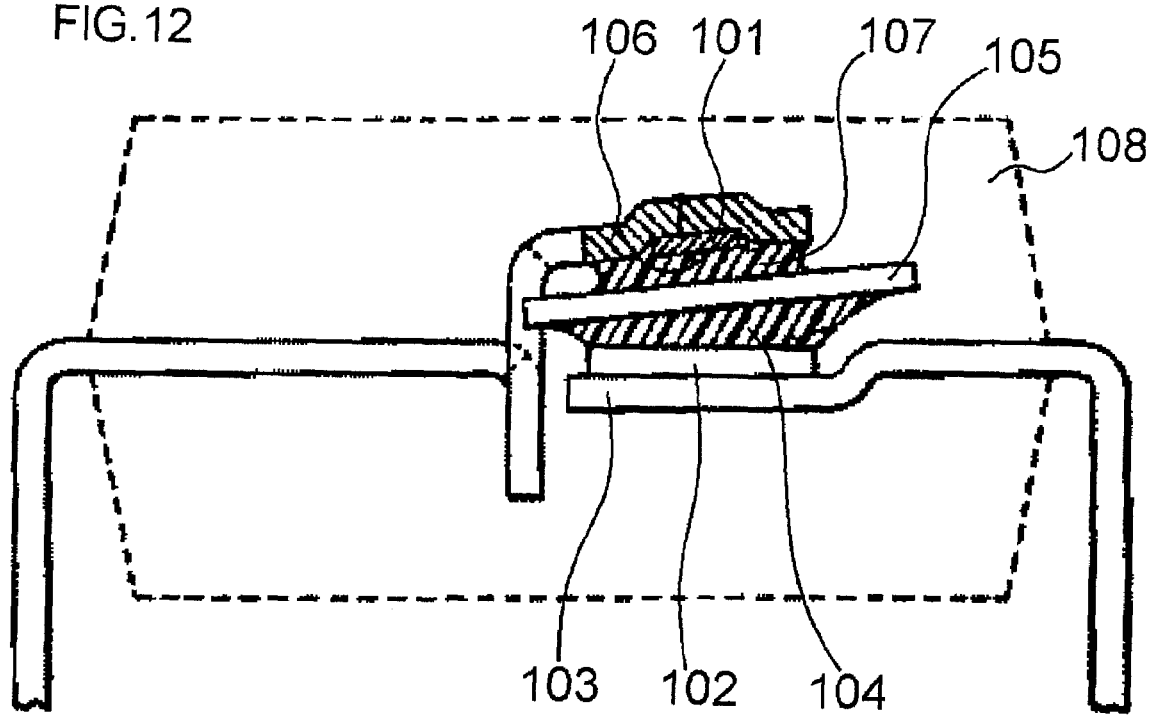
FIG. 12 is a diagram, useful in describing an embodiment of the process for manufacturing the photo coupler according to the conventional photo coupler.
Figure 13:
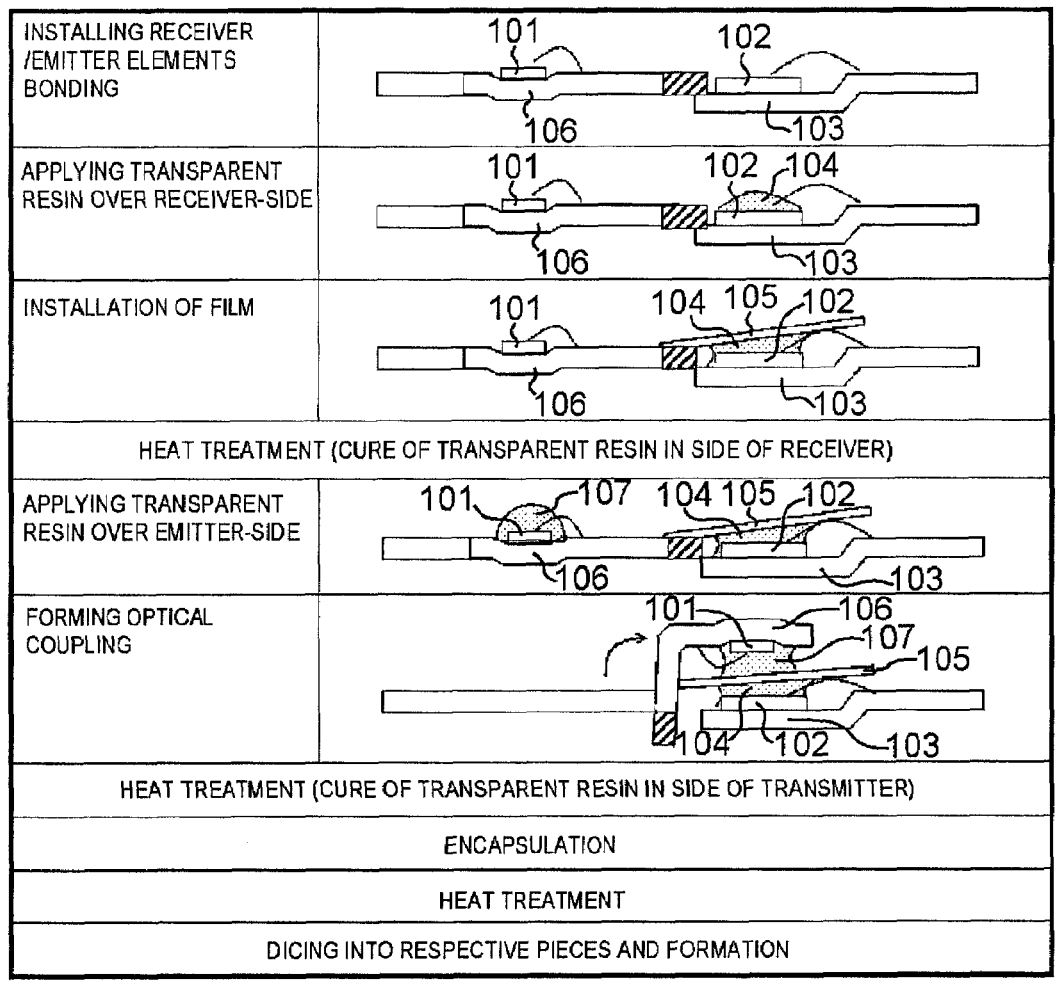
FIG. 13 is a diagram, useful in describing an embodiment of the process for manufacturing the photo coupler according to the conventional photo coupler.
Figure 14A:
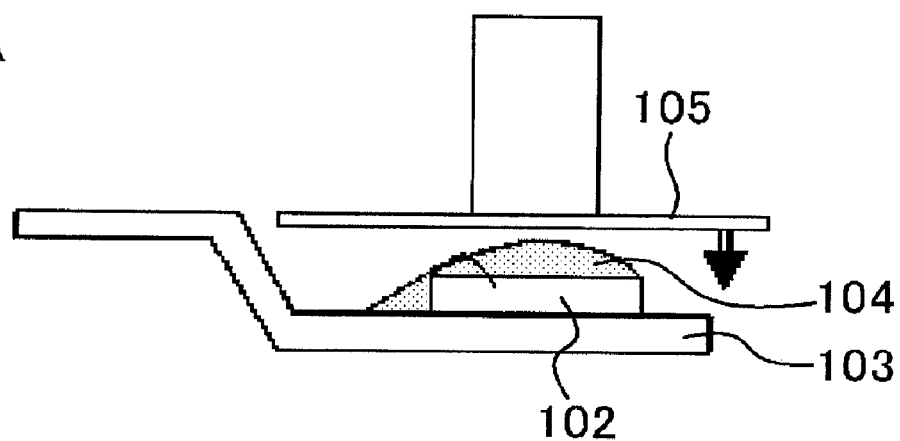
FIGS. 14A to 14C are diagrams, useful in describing a problem in the process for manufacturing the photo coupler according to the conventional photo coupler.
Figure 14B:
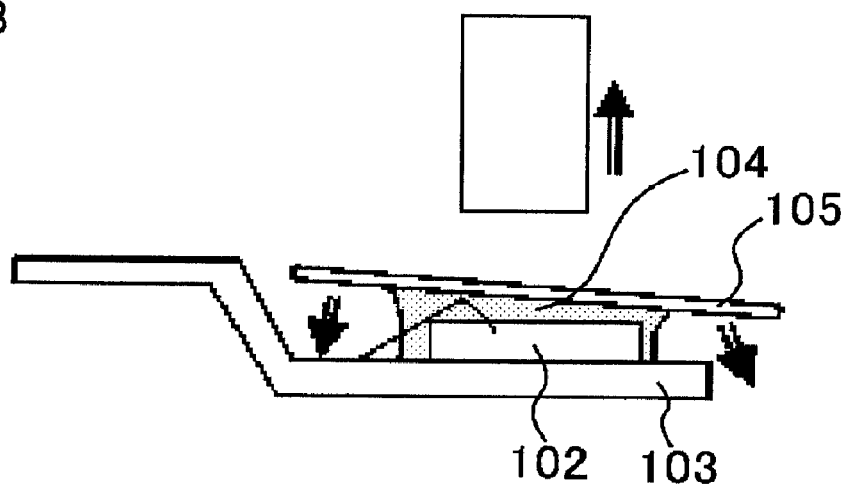
Figure 14C:
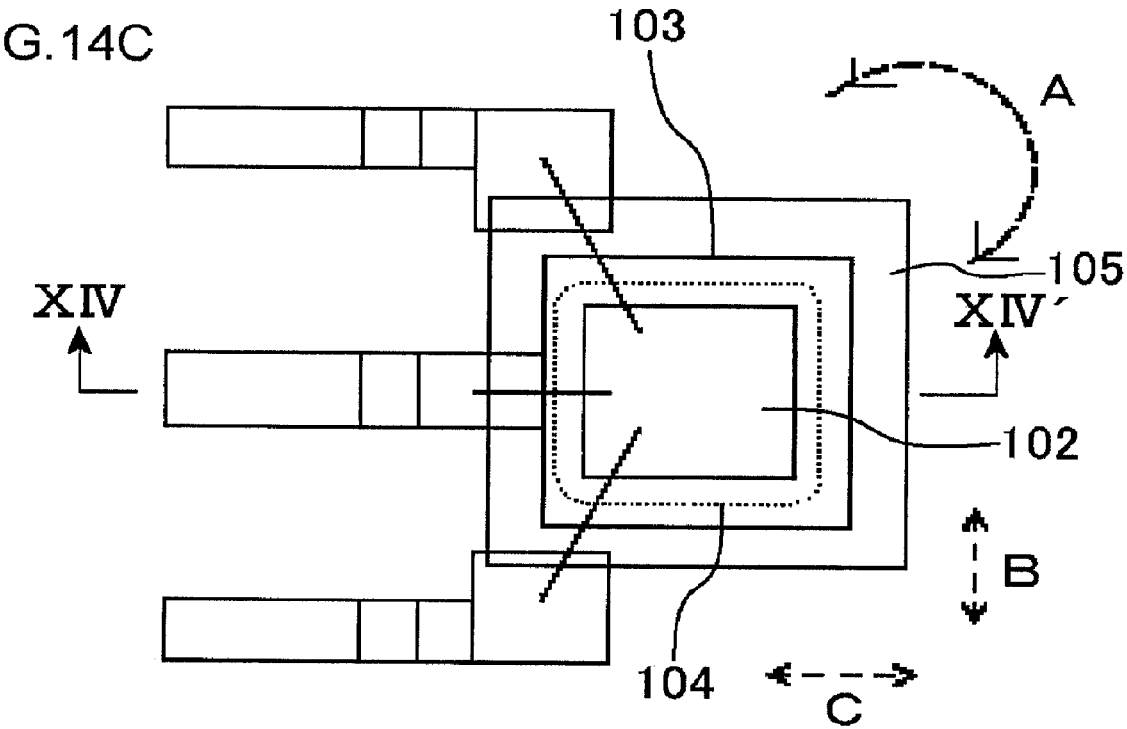
Figure 15A:
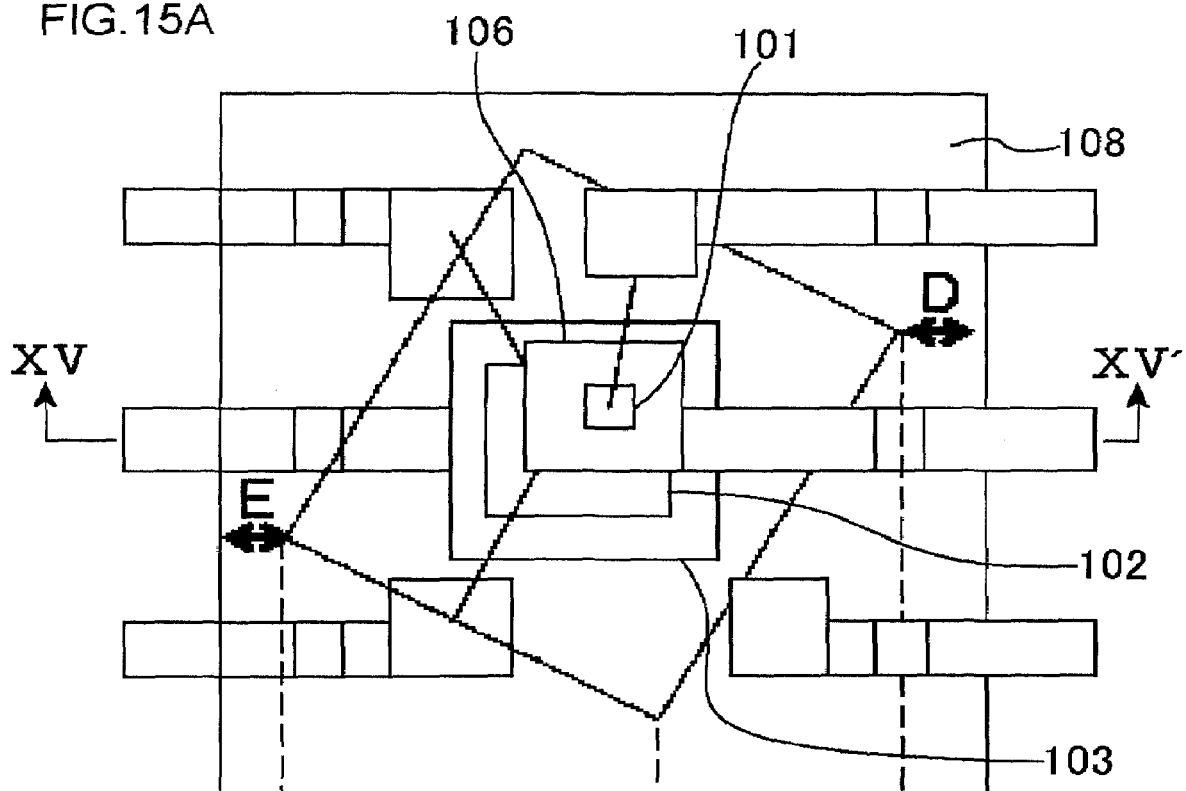
FIG. 15A is a schematic plan view, useful in describing a problem in the process for manufacturing the photo coupler according to the conventional photo coupler.
Figure 15B:
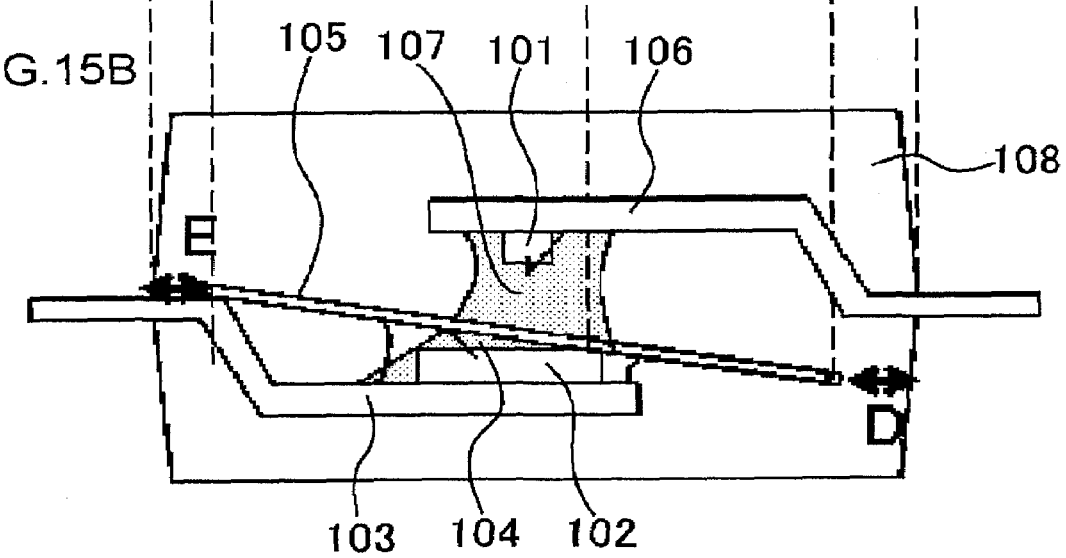
FIG. 15B is a cross-sectional view, useful in describing a problem in the process for manufacturing the photo coupler according to the conventional photo coupler.

On the contrary, since the electrically insulating film 5 is supported by the lead frame 3 in the side having the electrically insulating film 5 installed thereon in the structure of the present embodiment, the other lead frame 6 is not in contact with the electrically insulating film 5. More specifically, the electrically insulating film 5 is in contact only with the lead frame 3 and not in contact with the lead frame 6. Therefore, sufficient internal creeping distance can be assured, and the unwanted rotation can be inhibited without reducing an isolation voltage. Further, according to the present embodiment, a dead space as indicated by "F" in FIG. 11 is not created, and an additional allowance of the package size in consideration of an unwanted rotation and dislocation of the electrically insulating film 5 is not required, so that photo coupler having smaller package size can be manufactured.

Figure 16A:
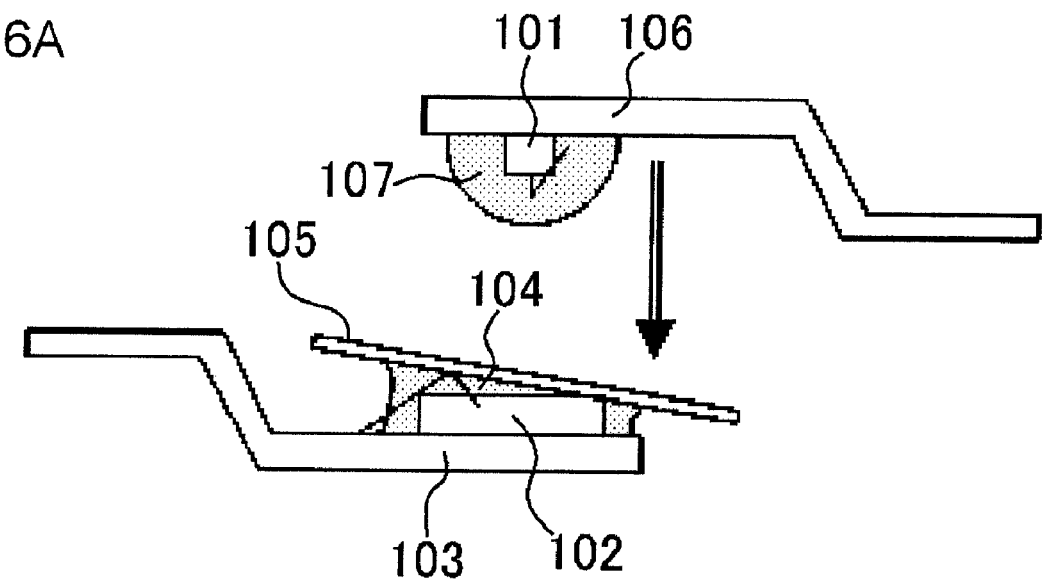
FIGS. 16A to 16B are diagrams, useful in describing a problem in the process for manufacturing the photo coupler according to the conventional photo coupler.
Figure 16B:
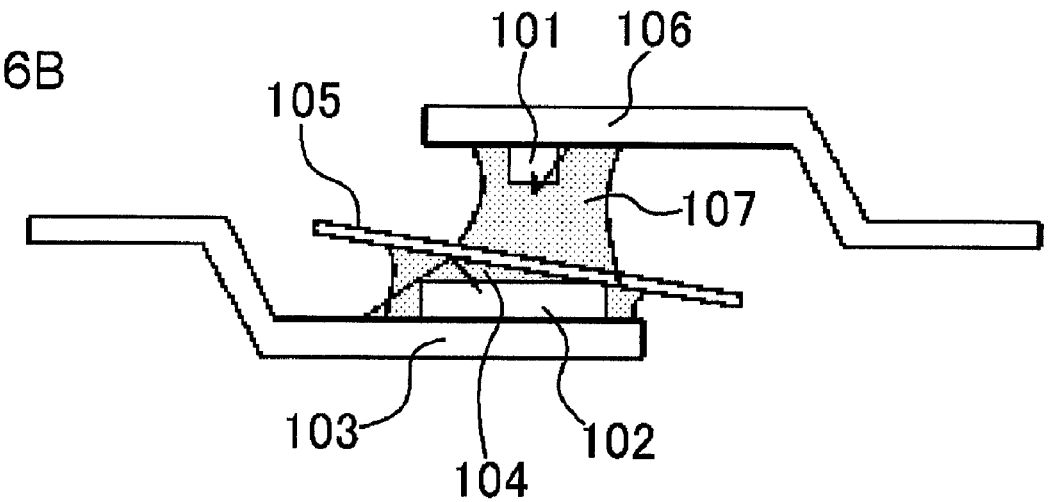

Further, in a general process for manufacturing photo couplers, as shown in FIG. 16A and FIG. 16B, the electrically insulating film 105 is installed, and then a silicone resin 107 is applied over the light emitting element 101, and the light emitting element 101 is superimposed over the electrically insulating film 105. A positional variation of the electrically insulating film 105 may lead to a variation of geometry of the silicone resin 107. Then, the variation of the geometry of the silicone resin 107 may directly lead to a variation of an optical path or an internal creeping distance, and may further lead to variations of characteristics of products such as isolation voltage, receiving sensitivity or the like, eventually leading to a deterioration in the production yield of the couplers.

On the contrary, since the configuration of the present embodiment provides a reduced positional variation of the electrically insulating film 5, a stable geometry of the resin 7 can be achieved. Thus, variations in the isolation voltages or the receiving sensitivities can be reduced.

Figure 5A:
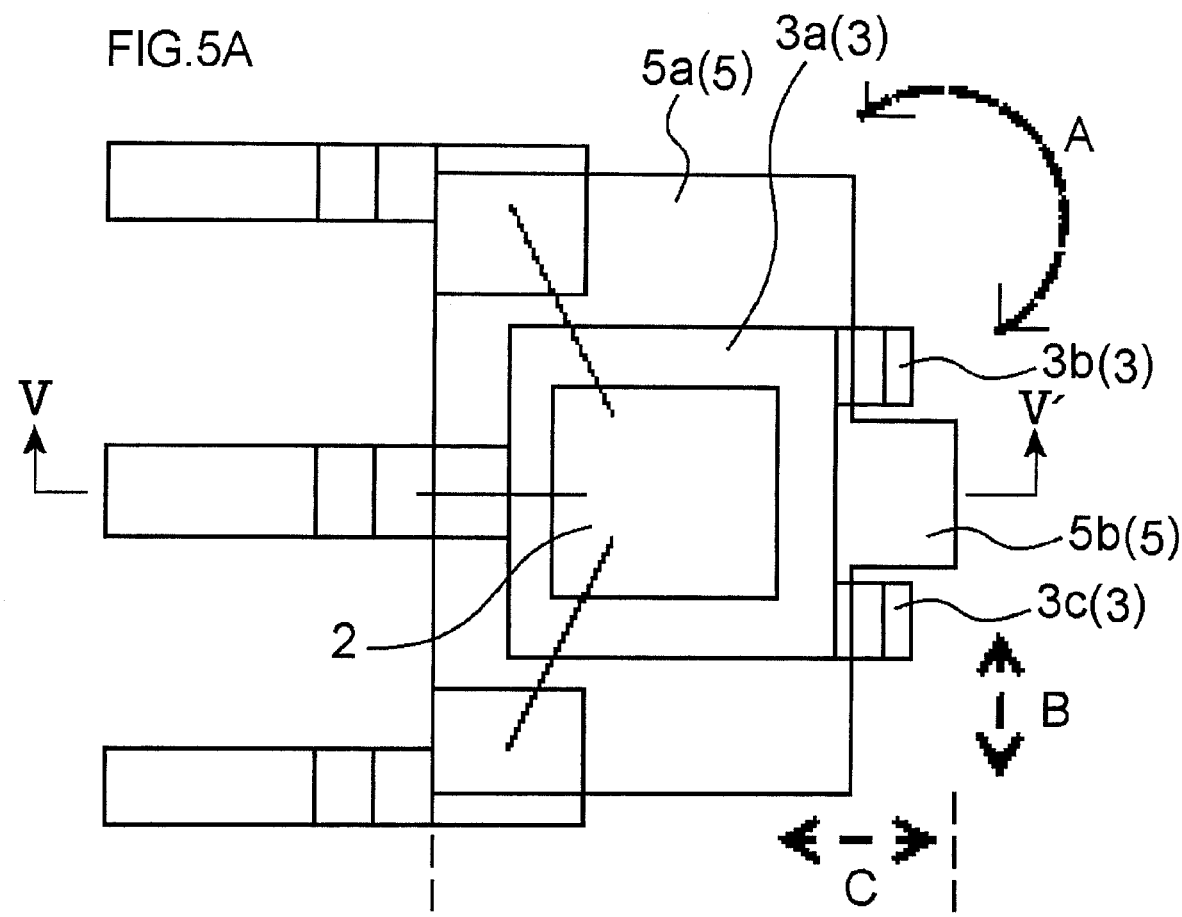
FIG. 5A is a schematic plan view, illustrating a modified embodiment according to the present invention.
Figure 5B:
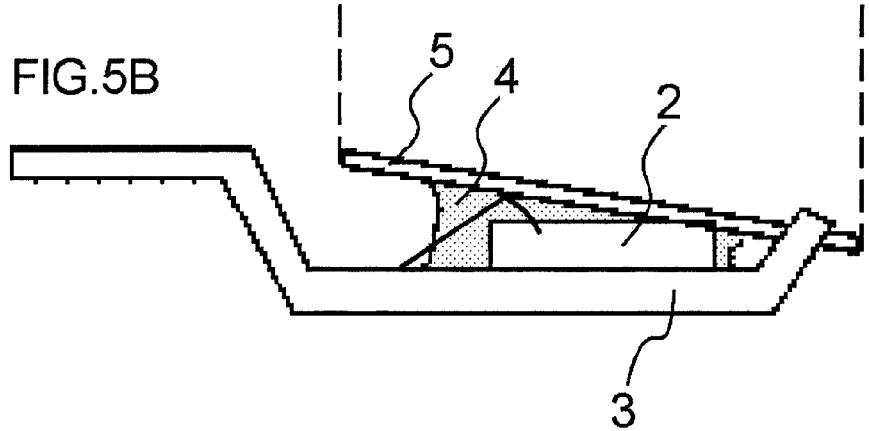
FIG. 5B is a cross-sectional view, illustrating a modified embodiment according to the present invention.

The present invention is not limited to the above-described embodiments, and various modifications thereof may also be included. For example, geometries of the lead frame 3 and/or the electrically insulating film 5 may be geometries shown in FIG. 5A to FIG. 7B. In FIGS. 5A and 5B, the electrically insulating film 5 is composed of the base 5a and the protruding portion 5b. Further, the lead frame 3 is composed of the base 3a and the protruding portions 3b and 3c. The protruding portion 5b of the electrically insulating film 5 is disposed between the protruding portions 3b and 3c of the lead frame 3.

Figure 6A:
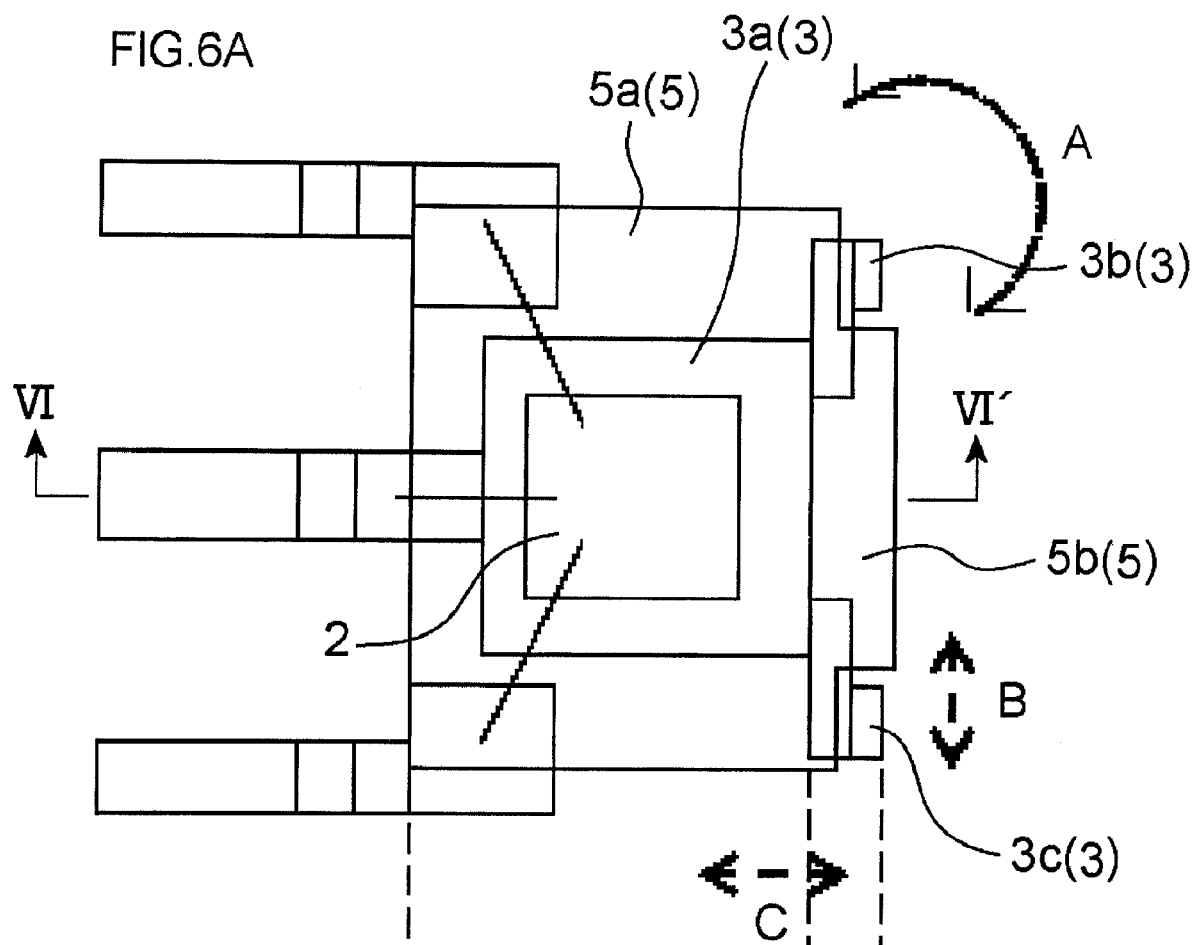
FIG. 6A is a schematic plan view, illustrating a modified embodiment according to the present invention.
Figure 6B:
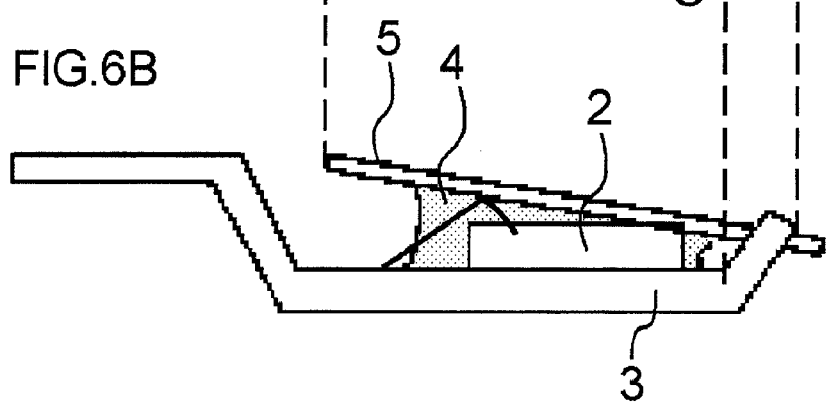
FIG. 6B is a cross-sectional view, illustrating a modified embodiment according to the present invention.

In FIGS. 6A and 6B, the electrically insulating film 5 is composed of the base 5a and the protruding portion 5b. Further, the lead frame 3 is composed of the base 3a and the protruding portions 3b and 3c. A distance between the protruding portions 3b and 3c is larger than the width of the base 3a. The protruding portion 5b of the electrically insulating film 5 is disposed between the protruding portions 3b and 3c of the lead frame 3.

Figure 7A:
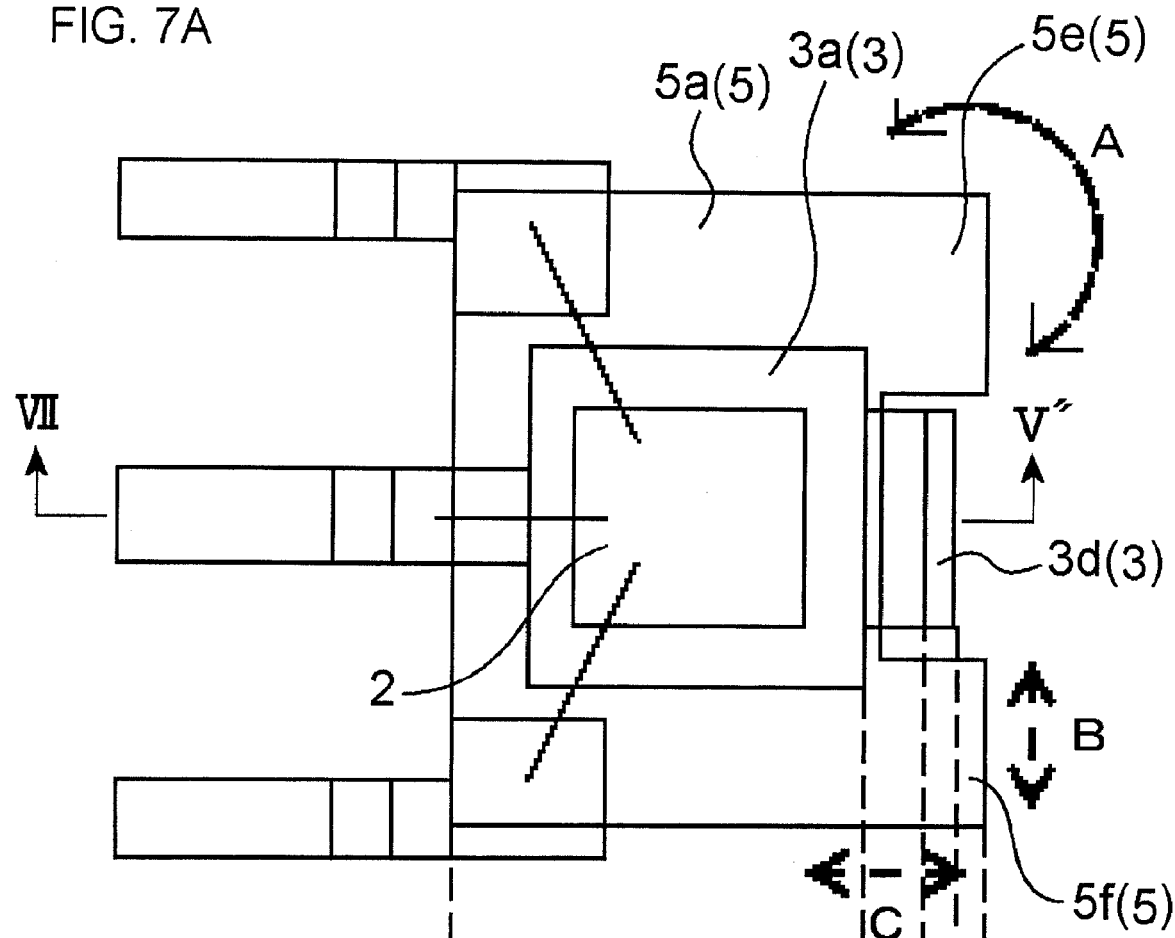
FIG. 7A is a schematic plan view, illustrating a modified embodiment according to the present invention.
Figure 7B:
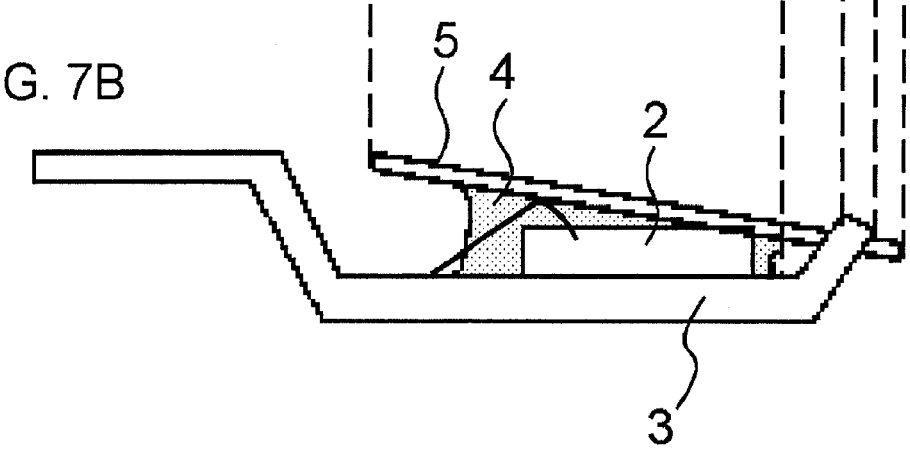
FIG. 7B is a cross-sectional view, illustrating a modified embodiment according to the present invention.
Figure 8:
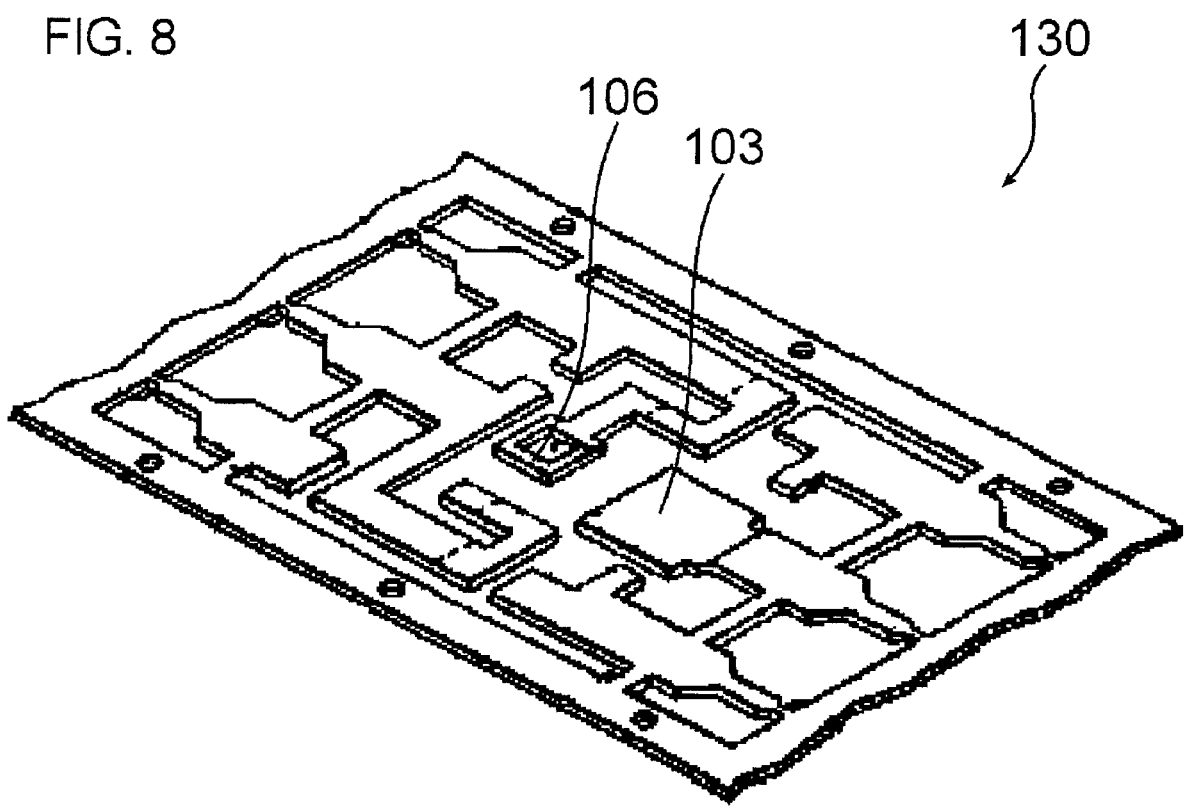
FIG. 8 is a diagram, useful in describing an embodiment of the process for manufacturing the photo coupler according to the conventional photo coupler.
Figure 9:
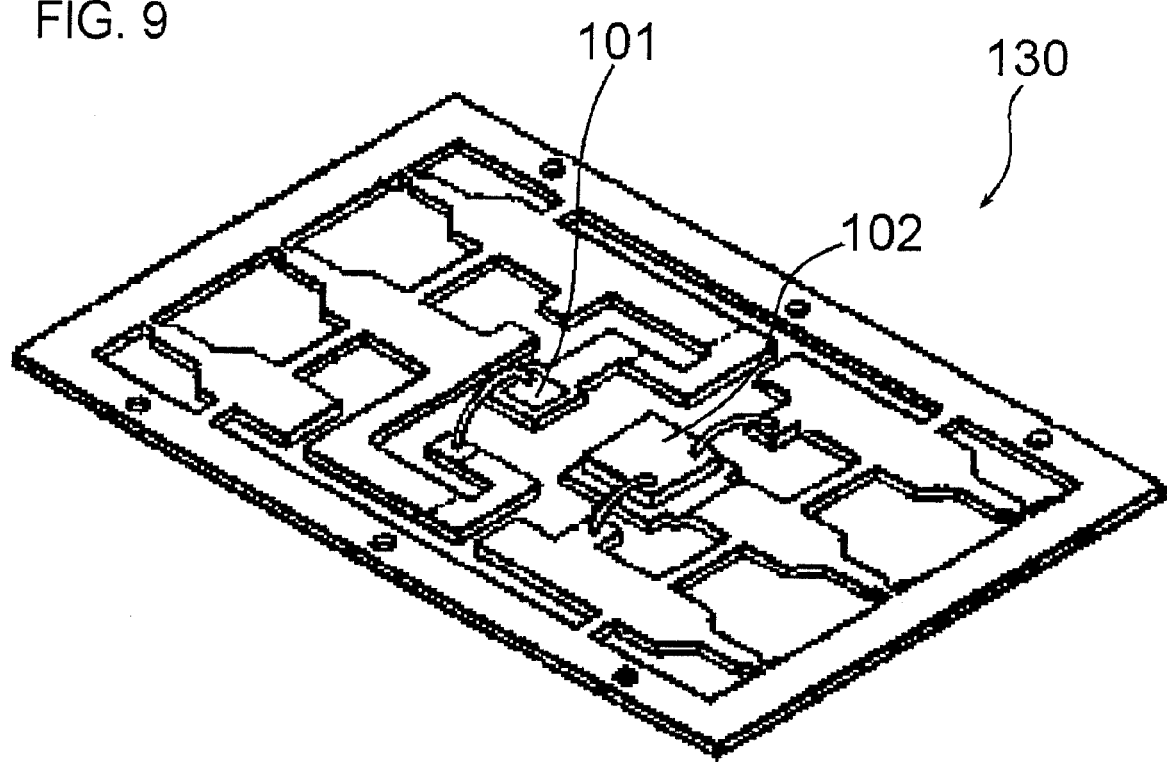
FIG. 9 is a diagram, useful in describing an embodiment of the process for manufacturing the photo coupler according to the conventional photo coupler.

In FIGS. 7A and 7B, the electrically insulating film 5 is composed of the base 5a, and the protruding portion 5e (first protruding portion) and the protruding portion 5f (second protruding portion) extending from the base 5a. Further, the lead frame 3 is composed of the base 3a and the protruding portion 3d (third protruding portion) protruding from the base 3a. The protruding portion 3d of the lead frame 3 is disposed between the protruding portions 5e and 5f of the electrically insulating film 5.

The exemplary implementation having the light receiving element 2 installed over the lead frame 3 and the light emitting element 1 installed over the lead frame 6 has been illustrated in the above-described embodiment. However, the light emitting element 1 may alternatively be installed over the lead frame 3, and the light receiving element 2 may also be installed over the lead frame 6.

It is apparent that the present invention is not limited to the above embodiment, and may be modified and changed without departing from the scope and spirit of the invention.

What is claimed is:

1. A photo coupler, comprising:
   a first lead frame;
   a second lead frame having an end section bent toward said first lead frame;
   a first optical device, which is one of a light emitting element and a light receiving element, and is fixed to said first lead frame;
   a second optical device, which is the other of said light emitting element and said light receiving element and is fixed to said second lead frame so as to be opposed to said first optical device; and
   an electrically insulating film, provided between said first optical device and said second optical device, and including an end section having protruding and contracting sections in plan view,
   wherein said end section of said second lead frame has protruding and contracting sections in plan view, and
   wherein said end section of said electrically insulating film is fitted in said end section of said second lead frame.

2. The photo coupler as set forth in claim 1,
   wherein said electrically insulating film is in contact with only said second lead frame and not in contact with said first lead frame.

3. The photo coupler as set forth in claim 1
   wherein said electrically insulating film includes a first base and a first protruding portion protruding from said first base,
   wherein said second lead frame includes a second base, and a second protruding portion and a third protruding portion protruding from said second base, and
   wherein said first protruding portion of said electrically insulating film is disposed between said second and said third protruding portions of said second lead frame.

4. The photo coupler as set forth in claim 3,
   wherein said electrically insulating film includes a fourth protruding portion and a fifth protruding portion, both of which protrude from said first base,
   said second protruding portion of said second lead frame is disposed between said first protruding portion and said fourth protruding portion of said electrically insulating film, and
   wherein said third protruding portion of said second lead frame is disposed between said first protruding portion and said fifth protruding portion of said electrically insulating film.

5. The photo coupler as set forth in claim 3,
   wherein a distance between said second protruding portion and said third protruding portion of said second lead frame is larger than a width of said second base.

6. The photo coupler as set forth in claim 1,
   wherein said electrically insulating film includes a first base, and a first protruding portion and a second protruding portion protruding from said first base,
   wherein said second lead frame includes a second base, and a third protruding portion protruding from said second base, and
   wherein said third protruding portion of said second lead frame is disposed between said first protruding portion and said second protruding portion of said electrically insulating film 7. A method for manufacturing the photo coupler as set forth in claim 1, comprising:
   fixing said first optical device and said second optical device to said first lead frame and said second lead frame, respectively;
   disposing said electrically insulating film over said second optical device fixed to said second lead frame, so that said end section of said electrically insulating film is fitted in said end section of said second lead frame; and
   fixing said first lead frame to said electrically insulating film, so that said first optical device faces said second optical device across said electrically insulating film.

* * * * *